(12) United States Patent
Yilmaz et al.

(10) Patent No.: US 9,825,104 B2
(45) Date of Patent: Nov. 21, 2017

(54) LOW-BIREFRINGENCE SUBSTRATE FOR TOUCH SENSOR

(71) Applicants: Esat Yilmaz, Santa Cruz, CA (US);
Neerja Saran, Fremont, CA (US);
David Brent Guard, Southampton (GB)

(72) Inventors: Esat Yilmaz, Santa Cruz, CA (US);
Neerja Saran, Fremont, CA (US);
David Brent Guard, Southampton (GB)

(73) Assignee: Atmel Corporation, San Jose, CA (US)

( * ) Notice: Subject to any disclaimer, the term of this patent is extended or adjusted under 35 U.S.C. 154(b) by 384 days.

(21) Appl. No.: 14/204,949

(22) Filed: Mar. 11, 2014

(65) Prior Publication Data

US 2014/0192277 A1 Jul. 10, 2014

Related U.S. Application Data

(63) Continuation-in-part of application No. 13/422,410, filed on Mar. 16, 2013, now Pat. No. 8,711,292.

(60) Provisional application No. 61/563,007, filed on Nov. 22, 2011.

(51) Int. Cl.
| | |
|---|---|
| *H01L 27/32* | (2006.01) |
| *G02B 1/10* | (2015.01) |
| *G02F 1/1333* | (2006.01) |
| *G06F 3/041* | (2006.01) |
| *G06F 3/044* | (2006.01) |

(52) U.S. Cl.
CPC ............. *H01L 27/323* (2013.01); *G02B 1/10* (2013.01); *G02F 1/13338* (2013.01); *G06F 3/044* (2013.01); *G06F 3/0412* (2013.01)

(58) Field of Classification Search
CPC .................................................. G02F 1/13363
See application file for complete search history.

(56) References Cited

U.S. PATENT DOCUMENTS

| | | | |
|---|---|---|---|
| 6,590,622 B1 * | 7/2003 | Nakanishi | ............... G06F 3/045 345/104 |
| 7,663,607 B2 | 2/2010 | Hotelling | |
| 7,864,503 B2 | 1/2011 | Chang | |
| 7,875,814 B2 | 1/2011 | Chen | |
| 7,920,129 B2 | 4/2011 | Hotelling | |
| 8,031,094 B2 | 10/2011 | Hotelling | |
| 8,031,174 B2 | 10/2011 | Hamblin | |
| 8,040,326 B2 | 10/2011 | Hotelling | |
| 8,049,732 B2 | 11/2011 | Hotelling | |
| 8,179,381 B2 | 5/2012 | Frey | |
| 8,217,902 B2 | 7/2012 | Chang | |

(Continued)

FOREIGN PATENT DOCUMENTS

WO WO 2012/129247 A2 9/2012

OTHER PUBLICATIONS

U.S. Appl. No. 61/454,936, filed Mar. 21, 2011, Myers.
U.S. Appl. No. 61/454,950, filed Mar. 21, 2011, Lynch.
U.S. Appl. No. 61/454,894, filed Mar. 21, 2011, Rothkopf.

*Primary Examiner* — Amare Mengistu
*Assistant Examiner* — Shawna Stepp Jones
(74) *Attorney, Agent, or Firm* — Baker Botts L.L.P.

(57) ABSTRACT

In one embodiment, an apparatus includes a substrate including material having a low birefringence. One or more electrodes of a touch sensor are disposed on the substrate.

20 Claims, 6 Drawing Sheets

(56) References Cited

U.S. PATENT DOCUMENTS

| | | | |
|---|---|---|---|
| 2006/0055855 A1* | 3/2006 | Duz | G02B 5/3041 349/117 |
| 2008/0262146 A1* | 10/2008 | Yonezawa | C08J 5/18 524/560 |
| 2008/0309635 A1 | 12/2008 | Matsuo | |
| 2009/0315854 A1 | 12/2009 | Matsuo | |
| 2012/0242588 A1 | 9/2012 | Myers | |
| 2012/0242592 A1 | 9/2012 | Rothkopf | |
| 2012/0243151 A1 | 9/2012 | Lynch | |
| 2012/0243719 A1 | 9/2012 | Franklin | |
| 2013/0076612 A1 | 3/2013 | Myers | |
| 2014/0055373 A1* | 2/2014 | Powell | G02F 1/13363 345/173 |

* cited by examiner ical stack.
LOW-BIREFRINGENCE SUBSTRATE FOR TOUCH SENSOR

PRIORITY

This application is a continuation-in-part under 35 U.S.C. §120 of U.S. patent application Ser. No. 13/422,410, filed 16 Mar. 2012, which claims the benefit, under 35 U.S.C. §119(e), of U.S. Provisional Patent Application No. 61/563,007 filed 22 Nov. 2011.

TECHNICAL FIELD

This disclosure generally relates to touch sensors.

BACKGROUND

A touch sensor may detect the presence and location of a touch or the proximity of an object (such as a user's finger or a stylus) within a touch-sensitive area of the touch sensor overlaid on a display screen, for example. In a touch-sensitive-display application, the touch sensor may enable a user to interact directly with what is displayed on the screen, rather than indirectly with a mouse or touch pad. A touch sensor may be attached to or provided as part of a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch sensor.

There are a number of different types of touch sensors, such as (for example) resistive touch screens, surface acoustic wave touch screens, and capacitive touch screens. Herein, reference to a touch sensor may encompass a touch screen, and vice versa, where appropriate. When an object touches or comes within proximity of the surface of the capacitive touch screen, a change in capacitance may occur within the touch screen at the location of the touch or proximity. A touch-sensor controller may process the change in capacitance to determine its position on the touch screen.

A display screen includes a number of layers that form a display stack. The layers of the display stack enable the display screen to produce a color image. The number and type of layers depends on the type of display screen. For example, a Liquid Crystal Display (LCD) based display screen has different layers than an Organic Light Emitting Diode (OLED) based display screen. To form a touch screen, a touch sensor is typically placed over the display stack. For example, the touch sensor may be formed on a transparent cover. The transparent cover, with the touch sensor, is then placed over an already formed display stack. This arrangement negatively impacts the contrast ratio of the display screen. For example, there is typically an air gap between the display stack and the sensor which can create undesirable reflections.

DESCRIPTION OF EXAMPLE EMBODIMENTS

Figure 1:
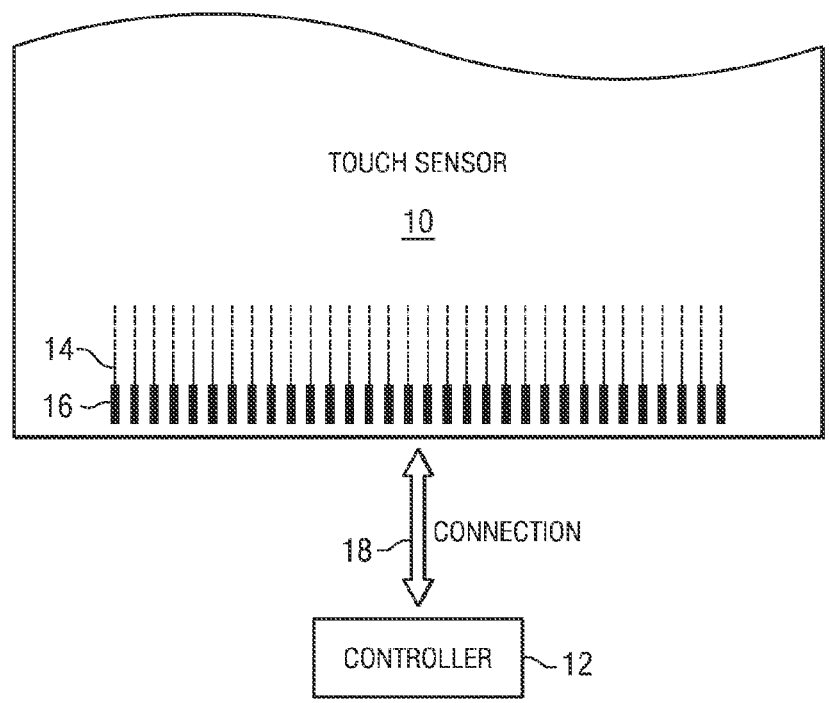
FIG. 1 illustrates an example touch sensor with an example controller.

FIG. 1 illustrates an example touch sensor 10 with an example touch-sensor controller 12. Touch sensor 10 and touch-sensor controller 12 may detect the presence and location of a touch or the proximity of an object within a touch-sensitive area of touch sensor 10. Herein, reference to a touch sensor may encompass both the touch sensor and its touch-sensor controller, where appropriate. Similarly, reference to a touch-sensor controller may encompass both the touch-sensor controller and its touch sensor, where appropriate. Touch sensor 10 may include one or more touch-sensitive areas, where appropriate. Touch sensor 10 may include an array of drive and sense electrodes (or an array of electrodes of a single type) disposed on one or more substrates, which may be made of a dielectric material and/or may be included in a display stack. Herein, reference to a touch sensor may encompass both the electrodes of the touch sensor and the substrate(s) that they are disposed on, where appropriate. Alternatively, where appropriate, reference to a touch sensor may encompass the electrodes of the touch sensor, but not the substrate(s) that they are disposed on.

An electrode (whether a drive electrode or a sense electrode) may be an area of conductive material forming a shape, such as for example a disc, square, rectangle, thin line, other suitable shape, or suitable combination of these. One or more cuts in one or more layers of conductive material may (at least in part) create the shape of an electrode, and the area of the shape may (at least in part) be bounded by those cuts. In particular embodiments, the conductive material of an electrode may occupy approximately 100% of the area of its shape. As an example and not by way of limitation, an electrode may be made of indium tin oxide (ITO) and the ITO of the electrode may occupy approximately 100% of the area of its shape (sometimes referred to as 100% fill), where appropriate. In particular embodiments, the conductive material of an electrode may occupy substantially less than 100% of the area of its shape. As an example and not by way of limitation, an electrode may be made of fine lines of metal or other conductive material (FLM) such as for example copper, silver, or a copper- or silver-based material and the fine lines of conductive material may occupy approximately 5% of the area of its shape in a hatched, mesh, or other suitable pattern. Herein, reference to FLM encompasses such material, where appropriate. Although this disclosure describes or illustrates particular electrodes made of particular conductive material forming particular shapes with particular fills having particular patterns, this disclosure contemplates any suitable electrodes made of any suitable conductive material forming any suitable shapes with any suitable fill percentages having any suitable patterns.

Where appropriate, the shapes of the electrodes (or other elements) of a touch sensor may constitute in whole or in part one or more macro-features of the touch sensor. One or more characteristics of the implementation of those shapes (such as, for example, the conductive materials, fills, or patterns within the shapes) may constitute in whole or in part one or more micro-features of the touch sensor. One or more macro-features of a touch sensor may determine one or more characteristics of its functionality, and one or more micro-features of the touch sensor may determine one or more optical features of the touch sensor, such as transmittance, refraction, or reflection.

A mechanical stack may contain the substrate (or multiple substrates) and the conductive material forming the drive or sense electrodes of touch sensor 10. In some embodiments, the mechanical stack may be within or comprise a display stack configured to generate images. As an example and not by way of limitation, the mechanical stack may include a first layer of optically clear adhesive (OCA) beneath a cover panel of a display stack. The cover panel may be clear and made of a resilient material suitable for repeated touching, such as for example glass, polycarbonate, or poly(methyl methacrylate) (PMMA). This disclosure contemplates any suitable cover panel made of any suitable material. The first layer of OCA may be disposed between a layer or substrate of the display stack and the substrate with the conductive material forming the drive or sense electrodes. The substrate with the conductive material may provide a benefit or feature in producing an image (e.g., it may be a layer or substrate found in a typical, non-touch, display stack) or it may be a layer added specifically to provide a substrate on which the electrodes are formed. In some embodiments, the mechanical stack may also include a second layer of OCA. In some embodiments, the mechanical stack may also include a dielectric layer (which may be made of polyethylene terephthalate (PET) or another suitable material, similar to the substrate with the conductive material forming the drive or sense electrodes). As an alternative, where appropriate, a thin coating of a dielectric material may be applied instead of the second layer of OCA and/or the dielectric layer. The second layer of OCA may be disposed between the substrate with the conductive material making up the drive or sense electrodes and the dielectric layer, and the dielectric layer may be disposed between the second layer of OCA and another layer of the display stack. As an example only and not by way of limitation, the cover panel may have a thickness of approximately 1 mm; the first layer of OCA may have a thickness of approximately 0.05 mm; the substrate with the conductive material forming the drive or sense electrodes may have a thickness of approximately 0.05 mm; the second layer of OCA may have a thickness of approximately 0.05 mm; and the dielectric layer may have a thickness of approximately 0.05 mm. Although this disclosure describes a particular mechanical stack with a particular number of particular layers made of particular materials and having particular thicknesses, this disclosure contemplates any suitable mechanical stack with any suitable number of any suitable layers made of any suitable materials and having any suitable thicknesses.

In particular embodiments, the drive or sense electrodes in touch sensor 10 may be made of ITO in whole or in part. In particular embodiments, the drive or sense electrodes in touch sensor 10 may be made of fine lines of metal or other conductive material. As an example and not by way of limitation, one or more portions of the conductive material may be copper or copper-based and have a thickness of approximately 5 µm or less and a width of approximately 10 µm or less. As another example, one or more portions of the conductive material may be silver or silver-based and similarly have a thickness of approximately 5 µm or less and a width of approximately 10 µm or less. This disclosure contemplates any suitable electrodes made of any suitable material.

Touch sensor 10 may implement a capacitive form of touch sensing. In a mutual-capacitance implementation, touch sensor 10 may include an array of drive and sense electrodes forming an array of capacitive nodes. A drive electrode and a sense electrode may form a capacitive node. The drive and sense electrodes forming the capacitive node may come near each other, but not make electrical contact with each other. Instead, the drive and sense electrodes may be capacitively coupled to each other across a space between them. A pulsed or alternating voltage applied to the drive electrode (by touch-sensor controller 12) may induce a charge on the sense electrode, and the amount of charge induced may be susceptible to external influence (such as a touch or the proximity of an object). When an object touches or comes within proximity of the capacitive node, a change in capacitance may occur at the capacitive node and touch-sensor controller 12 may measure the change in capacitance. By measuring changes in capacitance throughout the array, touch-sensor controller 12 may determine the position of the touch or proximity within the touch-sensitive area(s) of touch sensor 10.

In a self-capacitance implementation, touch sensor 10 may include an array of electrodes of a single type that may each form a capacitive node. When an object touches or comes within proximity of the capacitive node, a change in self-capacitance may occur at the capacitive node and touch-sensor controller 12 may measure the change in capacitance, for example, as a change in the amount of charge needed to raise the voltage at the capacitive node by a pre-determined amount. As with a mutual-capacitance implementation, by measuring changes in capacitance throughout the array, touch-sensor controller 12 may determine the position of the touch or proximity within the touch-sensitive area(s) of touch sensor 10. This disclosure contemplates any suitable form of capacitive touch sensing, where appropriate.

In particular embodiments, one or more drive electrodes may together form a drive line running horizontally or vertically or in any suitable orientation. Similarly, one or more sense electrodes may together form a sense line running horizontally or vertically or in any suitable orientation. In particular embodiments, drive lines may run substantially perpendicular to sense lines. Herein, reference to a drive line may encompass one or more drive electrodes making up the drive line, and vice versa, where appropriate. Similarly, reference to a sense line may encompass one or more sense electrodes making up the sense line, and vice versa, where appropriate.

Touch sensor 10 may have drive and sense electrodes disposed in a pattern on one side of a single substrate. In such a configuration, a pair of drive and sense electrodes capacitively coupled to each other across a space between them may form a capacitive node. For a self-capacitance implementation, electrodes of only a single type may be disposed in a pattern on a single substrate. In addition or as an alternative to having drive and sense electrodes disposed in a pattern on one side of a single substrate, touch sensor 10 may have drive electrodes disposed in a pattern on one side of a substrate and sense electrodes disposed in a pattern on another side of the substrate. Moreover, touch sensor 10 may have drive electrodes disposed in a pattern on one side of one substrate and sense electrodes disposed in a pattern on one side of another substrate. In such configurations, an intersection of a drive electrode and a sense electrode may form a capacitive node. Such an intersection may be a location where the drive electrode and the sense electrode "cross" or come nearest each other in their respective planes. The drive and sense electrodes do not make electrical contact with each other—instead they are capacitively coupled to each other across a dielectric at the intersection. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

As described above, a change in capacitance at a capacitive node of touch sensor 10 may indicate a touch or proximity input at the position of the capacitive node. Touch-sensor controller 12 may detect and process the change in capacitance to determine the presence and location of the touch or proximity input. Touch-sensor controller 12 may then communicate information about the touch or proximity input to one or more other components (such as one or more central processing units (CPUs)) of a device that includes touch sensor 10 and touch-sensor controller 12, which may respond to the touch or proximity input by initiating a function of the device (or an application running on the device) associated with it. Although this disclosure describes a particular touch-sensor controller having particular functionality with respect to a particular device and a particular touch sensor, this disclosure contemplates any suitable touch-sensor controller having any suitable functionality with respect to any suitable device and any suitable touch sensor.

Touch-sensor controller 12 may be one or more integrated circuits (ICs), such as for example general-purpose microprocessors, microcontrollers, programmable logic devices or arrays, or application-specific ICs (ASICs). In particular embodiments, touch-sensor controller 12 comprises analog circuitry, digital logic, and digital non-volatile memory. In particular embodiments, touch-sensor controller 12 is disposed on a flexible printed circuit (FPC) bonded to the substrate of touch sensor 10. The FPC may be active or passive, where appropriate. In particular embodiments, multiple touch-sensor controllers 12 are disposed on the FPC. Touch-sensor controller 12 may include a processor unit, a drive unit, a sense unit, and a storage unit. The drive unit may supply drive signals to the drive electrodes of touch sensor 10. The sense unit may sense charge at the capacitive nodes of touch sensor 10 and provide measurement signals to the processor unit representing capacitances at the capacitive nodes. The processor unit may control the supply of drive signals to the drive electrodes by the drive unit and process measurement signals from the sense unit to detect and process the presence and location of a touch or proximity input within the touch-sensitive area(s) of touch sensor 10. The processor unit may also track changes in the position of a touch or proximity input within the touch-sensitive area(s) of touch sensor 10. The storage unit may store programming for execution by the processor unit, including programming for controlling the drive unit to supply drive signals to the drive electrodes, programming for processing measurement signals from the sense unit, and other suitable programming, where appropriate. Although this disclosure describes a particular touch-sensor controller having a particular implementation with particular components, this disclosure contemplates any suitable touch-sensor controller having any suitable implementation with any suitable components.

Tracks 14 of conductive material disposed on the substrate of touch sensor 10 may couple the drive or sense electrodes of touch sensor 10 to connection pads 16, also disposed on the substrate of touch sensor 10. As described below, connection pads 16 facilitate coupling of tracks 14 to touch-sensor controller 12. Tracks 14 may extend into or around (e.g. at the edges of) the touch-sensitive area(s) of touch sensor 10. Particular tracks 14 may provide drive connections for coupling touch-sensor controller 12 to drive electrodes of touch sensor 10, through which the drive unit of touch-sensor controller 12 may supply drive signals to the drive electrodes. Other tracks 14 may provide sense connections for coupling touch-sensor controller 12 to sense electrodes of touch sensor 10, through which the sense unit of touch-sensor controller 12 may sense charge at the capacitive nodes of touch sensor 10. Tracks 14 may be made of fine lines of metal or other conductive material. As an example and not by way of limitation, the conductive material of tracks 14 may be copper or copper-based and have a width of approximately 100 µm or less. As another example, the conductive material of tracks 14 may be silver or silver-based and have a width of approximately 100 µm or less. In particular embodiments, tracks 14 may be made of ITO in whole or in part in addition or as an alternative to fine lines of metal or other conductive material. Although this disclosure describes particular tracks made of particular materials with particular widths, this disclosure contemplates any suitable tracks made of any suitable materials with any suitable widths. In addition to tracks 14, touch sensor 10 may include one or more ground lines terminating at a ground connector (which may be a connection pad 16) at an edge of the substrate of touch sensor 10 (similar to tracks 14).

Connection pads 16 may be located along one or more edges of the substrate, outside the touch-sensitive area(s) of touch sensor 10. As described above, touch-sensor controller 12 may be on an FPC. Connection pads 16 may be made of the same material as tracks 14 and may be bonded to the FPC using an anisotropic conductive film (ACF). Connection 18 may include conductive lines on the FPC coupling touch-sensor controller 12 to connection pads 16, in turn coupling touch-sensor controller 12 to tracks 14 and to the drive or sense electrodes of touch sensor 10. This disclosure contemplates any suitable connection 18 between touch-sensor controller 12 and touch sensor 10.

Figure 2:
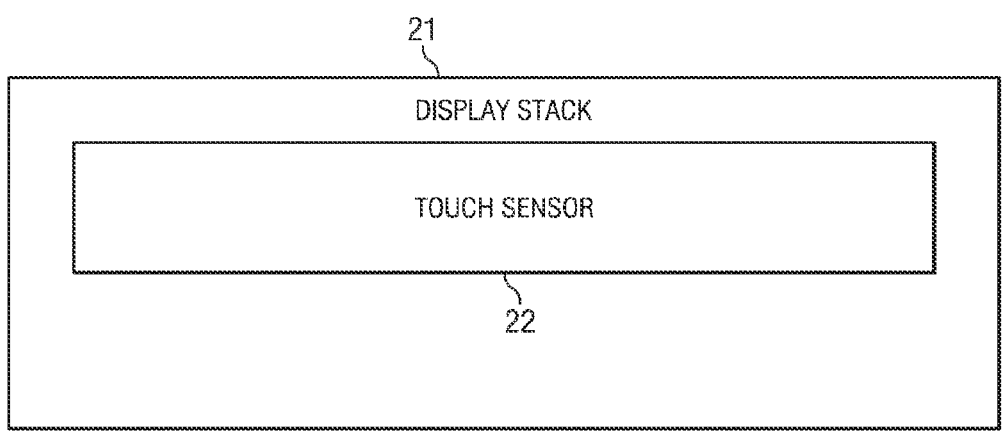
FIG. 2 illustrates a block diagram of a touch sensor provided within a display stack.

FIG. 2 illustrates a block diagram of touch sensor 22 provided within display stack 21, in accordance with particular embodiments. Display stack 21 may comprise a plurality of layers configured to generate a color image. The type and number of layers within display stack 21 may vary depending on the type of display stack and/or the intended application of the display stack. For example, an LCD based display stack 21 may include two or more polarizers while an OLED based display stack may include only one, or no, polarizers. Each layer may comprise a particular feature or characteristic used in a display stack for generating an image. These layers may in some embodiments, be configured to provide a color image. Particular embodiments contemplate display stack 21 comprising any number and/or type of layers for any type of display. In some embodiments, display stack 21 may be a flexible display stack. In some embodiments, display stack 21 may comprise a curved surface (as opposed to the straight surface depicted in FIGS. 3 through 6).

One or more components of touch sensor 22 may be integrated into display stack 21 in any of a variety of different ways, depending on operational needs or the particular embodiment. Touch sensor 22 may be located in any of a variety of different locations within display stack 21. The location of touch sensor 22 may vary depending on the type of display stack 21 (e.g., an LCD display, OLED display, etc.). For example, in an LCD display in which display stack 21 includes one or more polarizers, touch sensor 22 may be positioned within display stack 21 so as to not alter the polarization of the light before it passes through one or more of the polarizers. For example in an LCD display stack 21, if touch sensor 22 includes a substrate made of a birefringent material, then touch sensor 22 may be positioned above any polarizers within display stack 21. If touch sensor 22 includes a substrate made of a non-birefringent material, touch sensor 22 may be positioned between the polarizers of display stack 21. As another example, in an OLED display stack 21, it may not matter whether or not touch sensor 22 uses a birefringent material. This may allow touch sensor 22 to be positioned within any appropriate location within display stack 21. As yet another example, in some embodiments touch sensor 22 may use an existing layer (e.g., a layer found in a typical non-touch display stack, such as the color filter layer or one of the polarizer layers, etc.) of display stack 21 as its substrate.

Touch sensor 22 may be similar to, and comprise similar components and functionality, as touch sensor 10 described above with respect to FIG. 1. Depending on the embodiment, and/or operational needs, touch sensor 22 may be a laminated layer within display stack 21, or one or more of the components of touch sensor 22 (e.g., fine line metal electrodes for sensing a touch input) may be deposited on an existing layer of display stack 21. This may allow the touch sensing functionality to be included during the manufacturing of display stack 21. In embodiments in which touch sensor 22 is deposited on an existing layer of display stack 21, the existing layer of display stack 21 may function as the substrate for touch sensor 22. In other embodiments, touch sensor 22 may comprise its own substrate that is placed within display stack 21. Depending on the type of display and/or the desired location of touch sensor 22 within display stack, the substrate used for touch sensor 21 may be made of a birefringent material or a non-birefringent material. In certain embodiments, having touch sensor 22 within display stack 21 allows for a display stack with touch sensing capability that is substantially free of any air gaps between touch sensor 22 and display stack 21. As such, in certain embodiments, having touch sensor 22 within display stack 21 allows for a display stack with touch sensing capability that is thinner than a traditional display stack with a touch sensor added on top of the display stack.

FIGS. 3 through 6 depict various embodiments illustrating different locations of the electrodes of a touch sensor within a display stack, different types of touch sensors, and different types of display stacks. The illustrated embodiments are not intended to be exhaustive of all possible combinations. For example, one embodiment that may be within the scope of the claims but is not depicted may comprise a double sided sensor in which electrodes are deposited on either side of a color filter of an OLED. Other configurations and embodiments are within the scope of the appended claims and are contemplated by the inventors.

Figure 3:
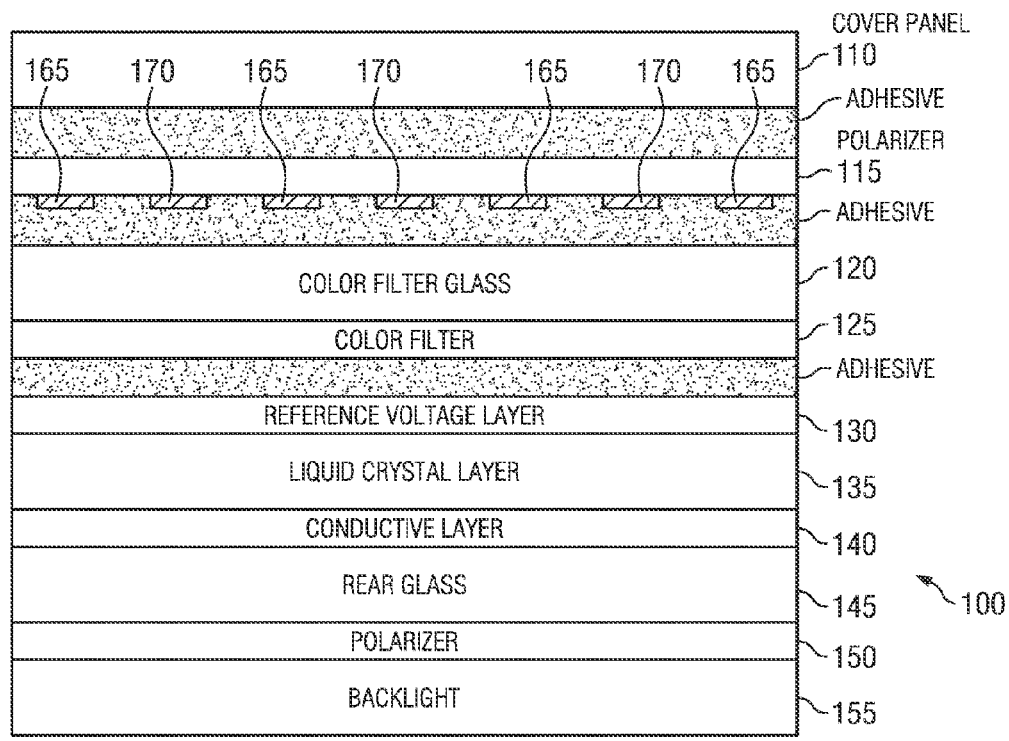
FIG. 3 illustrates a single sided touch sensor in which the electrodes are located on the bottom surface of a polarizer of an LCD display stack.

FIG. 3 illustrates a single-sided touch sensor in which the electrodes are located on the bottom surface of a polarizer of an LCD display stack, in accordance with particular embodiments. Display stack 100 includes cover panel 110, polarizer 115, color filter glass 120, color filter 125, reference voltage layer 130, liquid crystal 135, conductive layer 140, rear glass 145, polarizer 150, backlight source 155, sense electrodes 165, and drive electrodes 170. One or more adhesive layers (e.g., OCA) may be used in display stack 100 to bind layers to one another. The depicted embodiment illustrates some adhesive layers, but not necessarily all, adhesive layers. The depicted layers may cumulatively form a display stack of a display screen with integrated touch functionality.

Cover panel 110 may be a transparent surface designed to withstand repeated touching from a user. In some embodiments, cover panel 110 may be similar to the top layer of a typical display stack or a typical touch screen. In the depicted embodiment, cover panel 110 is part of the display stack of the touch screen. This is in contrast to a typical touch screen in which the cover panel is separate from the display stack and there is a small air gap between the cover panel and the display stack. In the depicted embodiment, cover panel 110 may be clear and made of a resilient material suitable for repeated touching, such as for example glass, polycarbonate, or poly(methyl methacrylate) (PMMA). This disclosure contemplates any suitable cover panel made of any suitable material.

In the depicted embodiment, sense and drive electrodes 165 and 170 are used to determine the position of a touch input on the touch screen. The touch input may be received from any of a variety of sources including, but not limited to, one or more fingers or a stylus. In the depicted embodiment, both electrodes 165 and 170 are located on the same side of polarizer 115. In the depicted embodiment, sense electrodes 165 and drive electrodes 170 are deposited on the bottom surface of polarizer 115. In some embodiments, sense electrodes 165 and drive electrodes 170 may comprise fine lines of metal deposited on polarizer 115. In the depicted embodiments, polarizer 115 acts as a substrate for the touch sensor, including sense electrode 165 and drive electrode 170. This may reduce the overall thickness of a touch screen using display stack 100 by removing the use of a separate substrate specifically for the sense electrodes 165 and drive electrodes 170. Using an existing layer (e.g., polarizer 115) of display stack 100 may improve image quality by reducing the number of layers light has to travel through. In some embodiments, sense electrodes 165 and drive electrodes 170 may be deposited on a separate touch sensor substrate (not depicted) that is added within display stack 100. In some embodiments, sense electrodes 165 and drive electrodes 170 and the touch substrate may be laminated on top of polarizer 115. If the sense electrodes 165 and drive electrodes 170 are positioned above polarizer 115, it may not be necessary to use a non-birefringent material for the touch sensor substrate. An adhesive layer may provide adhesion for layers added on top of sense electrodes 165 and drive electrodes 170.

Figure 4:
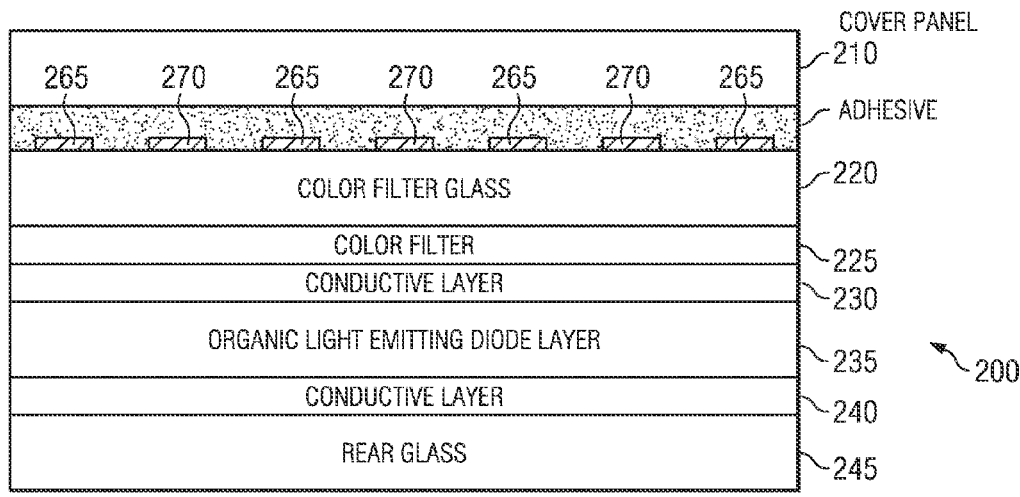
FIG. 4 illustrates a single sided touch sensor in which the electrodes are located on the top surface of a glass layer of an OLED display stack.

FIG. 4 illustrates a single-sided touch sensor in which the electrodes are located on the top surface of a glass layer of an OLED display stack, in accordance with particular embodiments. OLED display stack 200 includes cover panel 210, color filter glass 220, color filter 225, conductive layer 230, organic light emitting diode (OLED) layer 235, conductive layer 240, and rear glass 245. One or more adhesive layers (e.g., OCA) may be used in display stack 100 to bind layers to one another. The depicted embodiment illustrates some adhesive layers, but not necessarily all, adhesive layers. In the depicted embodiment, sense electrodes 265 and drive electrodes 270 are both located along the top surface of color filter glass 220. They may be deposited or laminated thereon.

In some embodiments, sense electrodes 265 and drive electrodes 270 may be located on a touch sensor substrate (not depicted) added to display stack 200. Because display stack 200 is an OLED, the material used for the touch sensor, (e.g., non-birefringent or birefringent) may be of less importance than with an LCD. That is, any polarizing effect of the added touch sensor substrate may not negatively impact the non-polarized light coming from OLED 235. Depending on the embodiment or configuration of the OLED display device, display stack 200 may be flexible or rigid. In addition, display stack 200 may be straight (as depicted) or curved. In some embodiments, sense electrodes 265 and drive electrodes 270 may comprise fine line metal. In other embodiments, sense electrodes 265 and drive electrodes 270 may be formed from indium tin oxide (ITO).

Figure 5:
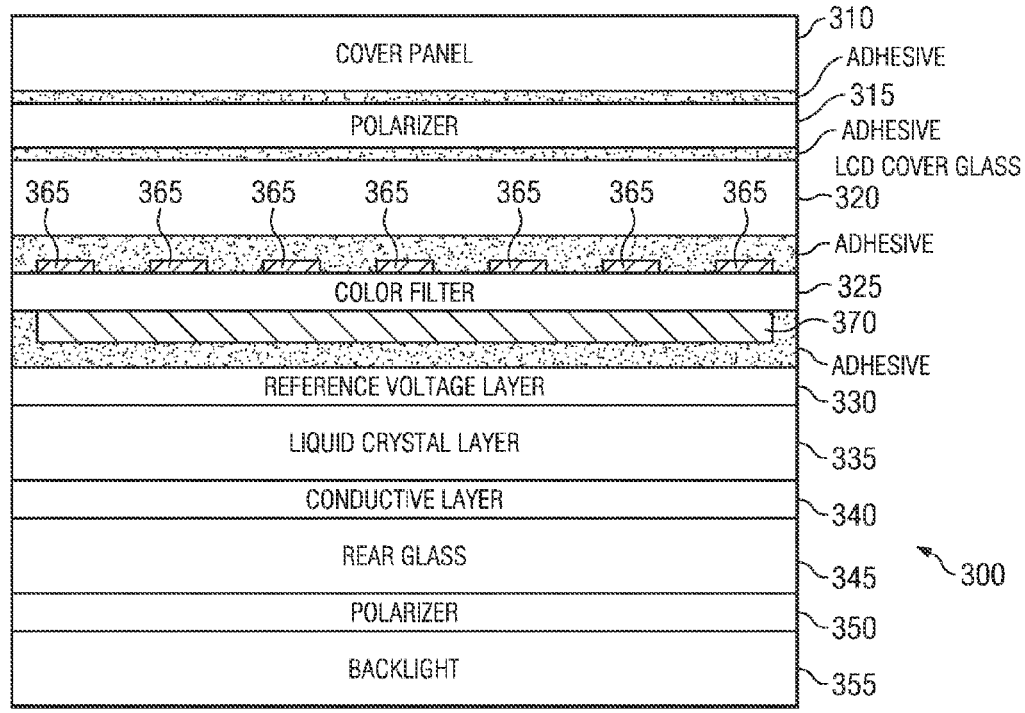
FIG. 5 illustrates a double sided touch sensor in which the electrodes are located on a top and bottom surface of a color filter layer of an LCD display stack.

FIG. 5 illustrates a double-sided touch sensor in which the electrodes are located on a top and bottom surface of a color filter layer of an LCD display stack, in accordance with particular embodiments. Display stack 300 includes cover panel 310, polarizer 315, LCD cover glass 320, color filter 325, reference voltage layer 330, liquid crystal 335, conductive layer 340, rear glass 345, polarizer 350, backlight source 355, sense electrodes 365, and drive electrodes 370. One or more adhesive layers (e.g., OCA) may be used in display stack 100 to bind layers to one another. The depicted embodiment illustrates some adhesive layers, but not necessarily all adhesive layers. In the depicted embodiment, sense electrodes are located on a top surface of color filter 325 and drive electrode 370 is located on a bottom surface of color filter 325. As can be seen in FIG. 5, sense electrodes 365 and drive electrode 370 are located on either side of an existing layer (color filter 325) of display stack 300. In the depicted embodiment color filter 325 acts as a substrate for sense electrodes 365 and drive electrodes 370. Depending on the topology of display stack 300, sense electrodes 365 and drive electrode 370 may be deposited on color filter layer 325. Because sense electrodes 365 and drive electrode 370 are located on an existing layer of display stack 300, the resulting touch functionality of display stack 300 may be thinner than a traditional LCD touch screen.

Figure 6:
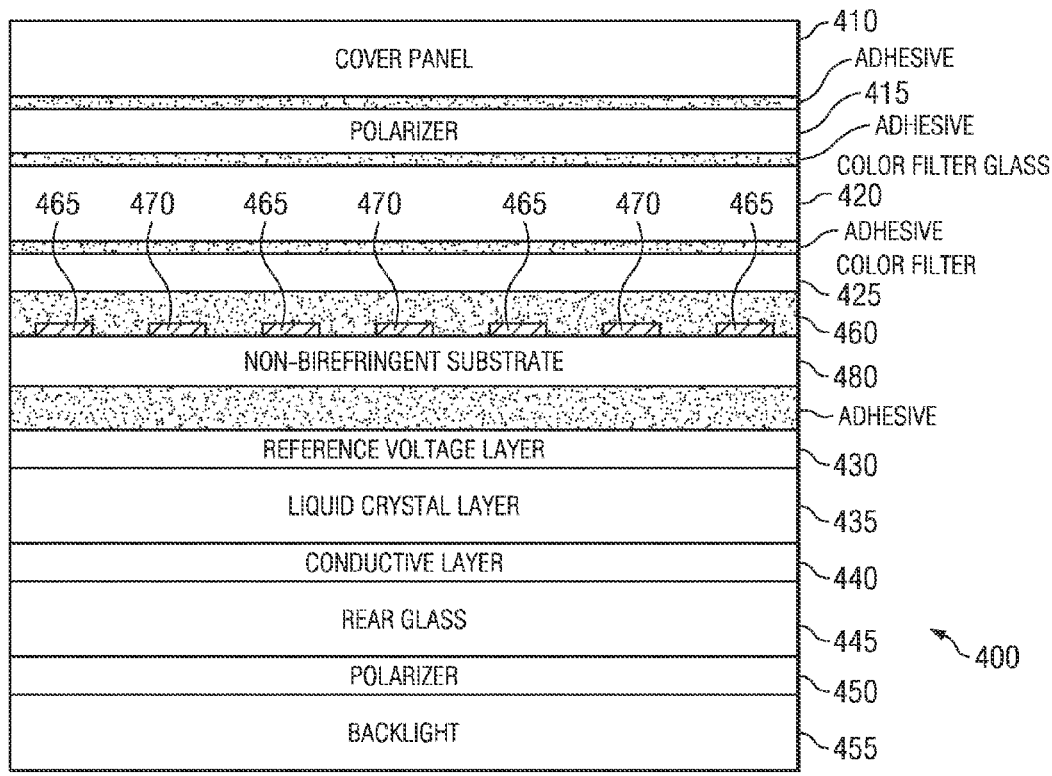
FIG. 6 illustrates a single sided touch sensor in which the electrodes are located on a non-birefringent layer below the polarizer of an LCD display stack.

FIG. 6 illustrates a single-sided touch sensor in which the electrodes are located on a non-birefringent layer below the polarizer of an LCD display stack. Display stack 400 includes cover panel 410, polarizer 415, color filter glass 420, color filter 425, reference voltage layer 430, liquid crystal 435, conductive layer 440, rear glass 445, polarizer 450, backlight source 455, sense electrodes 465, drive electrodes 470, non-birefringent layer 480. One or more adhesive layers (e.g., OCA) may be used in display stack 100 to bind layers to one another. The depicted embodiment illustrates some adhesive layers, but not necessarily all, adhesive layers.

The layers of display stack 400 may be similar to the layers of display stack 100 depicted in FIG. 3. One difference may be the inclusion of an additional layer, non-birefringent layer 480. As mentioned in previous figures, in some embodiments, an additional layer may be added to the display stack to serve as the substrate for the touch sensor. In FIG. 6, display stack 400 includes non-birefringent layer 480. Non-birefringent layer 480 provides a substrate on which sense electrodes 465 and drive electrodes 470 may be located. The electrodes may be deposited or laminated on non-birefringent layer 480. Because non-birefringent layer 480 is non-birefringent, it does not twist or otherwise re-polarize the already polarized light prior to passing through polarizer 415.

While FIGS. 3 through 6 have depicted various locations and configuration of touch sensor electrodes within different types of display stacks, one skilled in the art would appreciate that any configuration of touch sensors may be located in any suitable position within the display stack. Depending on the embodiment, the touch sensors may be deposited on, or laminated to, any suitable layer within a display stack. By way of example, and not by way of limitation, particular embodiments may comprise a touch sensor located under a linear and/or circular polarizer; a touch sensor located above the linear and/or circular polarizer; a touch sensor patterned on a linear and/or circular polarizer substrate; a touch sensor patterned under a linear and/or circular polarizer substrate; a touch sensor patterned on birefringent free material; a touch sensor patterned above and/or below a color filter layer; any of the above with a single sided sensor on one surface, where appropriate; any of the above with a dual sided sensor on both surfaces, where appropriate; any of the above with an AR layer; and/or any of the above with an AG layer. In certain embodiments, patterning the sensor on any optical component included within a display stack (e.g., polarizers, filters etc.) may reduce the overall thickness of a touch screen and may increase transmissivity as there is no separate substrate for the touch sensor through which light must travel. In particular embodiments, in addition to reducing reflected light from the touch electrodes, reflected light from other internal surfaces may be reduced. This may increase the effective contrast ratio of the LCD to ambient light—making the LCD more visible in direct sunlight or conversely reducing the required intensity of light from the LCD for a given contrast ratio (power saving).

Moreover, if a non-birefringent substrate, or any other additional substrate for the touch sensor, is added to the display stack, such a layer may be deposited or formed anywhere within the display stack. By incorporating the touch sensor, in any of the various locations, within the display stack, the manufacturing process may be simplified and the overall thickness of a touch screen may be reduced. The reduction is particularly evident where one of the existing layers of a traditional display stack is used as the substrate for the touch sensor. Furthermore, in particular embodiments, by locating the touch sensor within the display stack, the touch screen may be free of air gaps. This may improve the image quality (e.g., improve the perceived contrast ratio) of a touch screen.

Although this disclosure describes a particular mechanical stack and particular display stacks with particular numbers of particular layers made of particular materials and having particular thicknesses, this disclosure contemplates any suitable mechanical stack and/or display with any suitable number of any suitable layers made of any suitable materials and having any suitable thicknesses.

FIGS. 7 through 10 illustrate example cross-sections of example mechanical stacks 700. Mechanical stacks 700 illustrated in FIGS. 7 through 10 include polarization layer 740, display layer 730, and one or more layers of a touch sensor (e.g., low-birefringence substrate 480 and conductive material 724). In particular embodiments, display layer 730 may include one or more layers associated with a display screen, and display layer 730 may be referred to as a display or a display stack. In particular embodiments, display layer 730 illustrated in FIG. 7 (and FIGS. 8-11 described below) may be different from the display stacks illustrated in FIGS. 3-6. In particular embodiments, a mechanical stack 700 may refer to an assembly that includes one or more layers or one or more other stacks. In particular embodiments, the terms "layer" and "stack" may be used interchangeably. In particular embodiments, a mechanical stack may include a display stack. In particular embodiments, a display stack, such as for example, the display stacks illustrated in FIGS. 3-6, may include or may be referred to as a mechanical stack. In particular embodiments, display stack 700 illustrated in FIG. 7 (and in FIGS. 8-10) may also include one or more additional layers not shown in the figure. Although this disclosure describes and illustrates particular mechanical stacks and particular display stacks that include particular layers or particular stacks, this disclosure contemplates any suitable mechanical stack or any suitable display stack that includes any suitable layer or any suitable stack.

Figure 7:
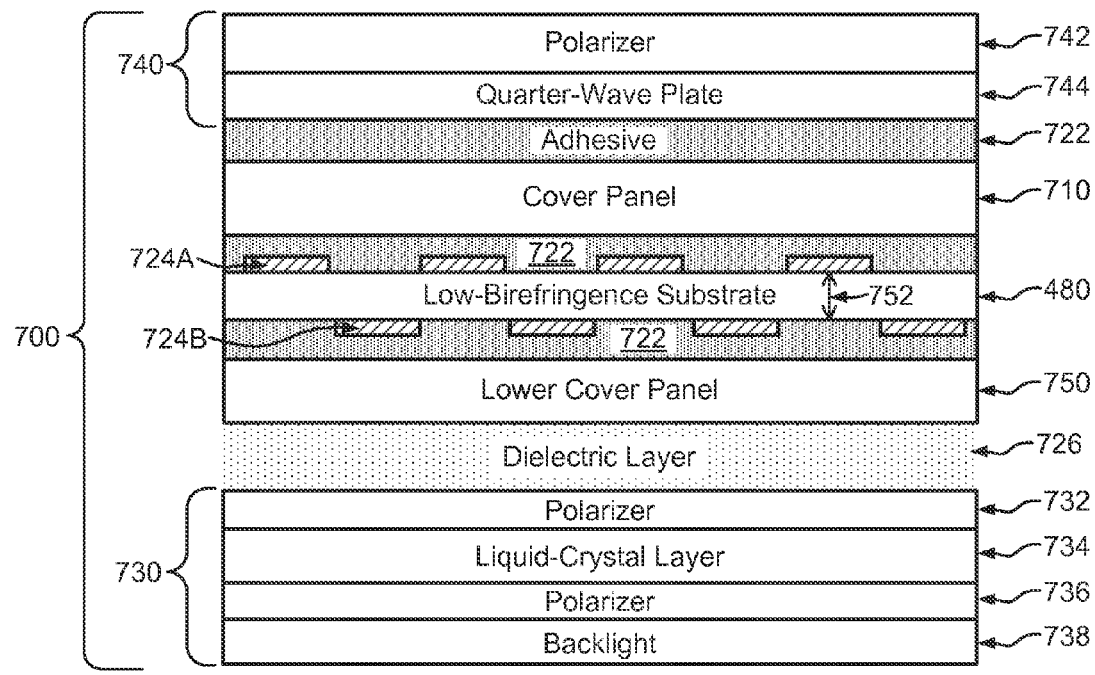
FIG. 7 illustrates an example cross-section of an example mechanical stack.

FIG. 7 illustrates an example cross-section of an example mechanical stack 700. In particular embodiments, mechanical stack 700 may include one or more adhesive layers 722 disposed between two adjacent layers of mechanical stack 700, and adhesive layer 722 may be configured to attach, bond, or hold together two adjacent layers. In the example of FIG. 7, an adhesive layer 722 is disposed between quarter-wave plate 744 and cover panel 710. An additional adhesive layer 722 is disposed between cover panel 710 and the top surface of substrate 480 upon which conductive material 724A is disposed. Another adhesive layer 722 is disposed between lower cover panel 750 and the bottom surface of substrate 480. In particular embodiments, adhesive layer 722 may be an OCA. As an example and not by way of limitation, adhesive layer 722 may be an ultraviolet-cured (UV-cured) material, such as for example, a liquid OCA (LOCA). In the example of FIG. 7 (as well as the examples of FIGS. 8-11 described below), additional layers of adhesive may be included in mechanical stack 700 but may not be illustrated in FIG. 7. As an example and not by way of limitation, polarizer 742 and quarter-wave plate 744 may be held together with an adhesive layer that is not shown in FIG. 7. Although this disclosure describes and illustrates particular layers of a mechanical stack held together by particular adhesive layers, this disclosure contemplates any suitable layers of a mechanical stack held together by any suitable adhesive layer.

In particular embodiments, display layer 730 may include an LCD, an OLED display, a light-emitting diode (LED) display, any suitable display type, or any suitable portion of a display. As an example and not by way of limitation, an OLED display may include a two-dimensional array of pixels, where each pixel may include one or more OLED sub-pixels, each OLED sub-pixel configured to produce a particular color, such as for example, red, green, or blue. In the example of FIG. 7, display layer 730 is an LCD-based display screen and includes backlight 738, polarizer 736, liquid-crystal layer 734, and polarizer 732. Polarizers 732 and 736 may be linear polarizers. Liquid-crystal layer 734 may include liquid-crystal molecules arranged in a two-dimensional array of pixels, where each liquid-crystal pixel may be configured to selectively to rotate the polarization of light from backlight 738 that is transmitted through polarizer 736. Display layer 730 may also include one or more additional layers not shown in FIG. 7, such as for example, one or more conductive layers, reference-voltage layers, color-filter layers, or rear-glass layers. Although this disclosure describes and illustrates particular displays having particular layers, this disclosure contemplates any suitable displays having any suitable layers.

Dielectric layer 726 in FIG. 7 is disposed between a bottom surface of lower cover panel 750 and a top surface of display layer 730. As an example and not by way of limitation, dielectric layer 726 may be an air gap. As an another example, dielectric layer 726 may be an adhesive layer (e.g., a layer of OCA). This disclosure contemplates any suitable dielectric layer 726 that includes any suitable dielectric material.

In particular embodiments, mechanical stack 700 may include conductive material 724 disposed on low-birefringence substrate 480, and conductive material 724 may form the drive or sense electrodes of a touch sensor. In particular embodiments, a touch sensor may include a single-sided substrate 480 with conductive material 724 disposed on one surface of substrate 480. In particular embodiments, a touch sensor may include a double-sided substrate 480 with conductive material 724 disposed on two surfaces of substrate 480. This disclosure contemplates any suitable single-sided substrate having conductive material 724 disposed on one side of the substrate as well as any suitable double-sided substrate having conductive material 724 disposed on two sides of the substrate. Additionally, this disclosure contemplates any suitable mechanical stack 700 having one substrate, two substrates, or any suitable number of substrates with conductive material disposed on one or two sides of each substrate. FIG. 7 illustrates a double-sided substrate 480 with conductive material 724A disposed on one surface of substrate 480 and conductive material 724B disposed on another opposing surface of substrate 480. In the example of FIG. 7, the sense electrodes of a touch sensor may include conductive material 724A, and the drive electrodes may include conductive material 724B. In particular embodiments, the sense or drive electrodes of a touch sensor may be formed from any suitable portion of conductive material 724A or 724B.

Conductive material 724 forming drive and sense electrodes of a touch sensor may include an area of conductive material 724 that forms a shape, such as for example a disc, square, rectangle, other suitable shape, or suitable combination of these, disposed on a surface of substrate 480. In particular embodiments, conductive material 724 of an electrode may be made from a conductive mesh of fine lines of conductive material 724, such as for example, carbon nanotubes, gold, aluminum, copper, silver, or copper- or silver-based material, or any suitable conductive material, and the fine lines of conductive material 724 may occupy a range of approximately 1% to approximately 10% of the area of its shape in a hatched or other suitable pattern. As another example, a conductive mesh may substantially cover an entire touch-sensitive area of the touch sensor. In particular embodiments, conductive material 724 may be opaque or substantially reflective. Although the fine lines of conductive material 724 may be opaque or substantially reflective, the combined optical transmittance of electrodes formed using a conductive mesh may be approximately 90% or higher, ignoring a reduction in transmittance due to other factors such as the substrate material. Thus, the contribution of the fine lines of conductive material 724 to the attenuation of light through the conductive mesh may be within a range of approximately 1% to approximately 10%. In other particular embodiments, the electrodes, tracks, and bond pads of the touch sensor may all be formed from conductive material 724.

In particular embodiments, one or more layers of mechanical stack 700 may be made from one or more materials that are substantially transparent to visible light. In particular embodiments, visible light may refer to wavelengths of light from approximately 390-450 nm at the blue-violet end of the visible spectrum to approximately 700-750 nm at the red end of the visible spectrum. As an example and not by way of limitation, visible light may include light in a wavelength range of approximately 400 nm to 700 nm. In particular embodiments, a material or layer of mechanical stack 700 that is substantially transparent to visible light may refer to a layer that transmits more than approximately 70%, 80%, or 90% of incident visible light, or more than any suitable percentage of incident visible light. In the example of FIG. 7, quarter-wave plate 744, adhesive layer 722, cover panel 710, low-birefringence substrate 480, lower cover panel 750, or dielectric layer 726 may be made of or may include one or more materials that are substantially transparent to visible light. Although this disclosure describes and illustrates particular layers of a mechanical stack having particular amounts of transmission to particular wavelengths of light, this disclosure contemplates any suitable layer of a mechanical stack having any suitable transmission to any suitable wavelengths of light.

In the example of FIG. 7 (and FIGS. 8-11 described below), substrate 480 is made of a material having low birefringence. In particular embodiments, substrate 480 may be made of a low-birefringence material, such as for example, cyclic olefin polymer (COP), cyclic olefin copolymer (COC), cyclic block copolymer (CBC), tri-acetate cellulose (TAC), polyethersulfone (PES), fiber-reinforced plastic (FRP), some forms of polycarbonate, glass (e.g., fused silica), or any other suitable material or suitable combination of materials having low birefringence. In particular embodiments, one or more other layers of mechanical stack 700 may be made of or may include one or more low-birefringence materials. As an example and not by way of limitation, cover panel 710 or lower cover panel 750 in FIG. 7 may be made of a material that has low birefringence. As another example and not by way of limitation, adhesive layer 722 may be an OCA with low birefringence. Although this disclosure describes and illustrates particular substrates and layers made of particular low-birefringence materials, this disclosure contemplates any suitable substrate or layer made of any suitable low-birefringence material.

In particular embodiments, low-birefringence substrate 480 may have a thickness 752 that is between approximately 10 μm and approximately 500 μm. As an example and not by way of limitation, low-birefringence substrate 480 may have a thickness 752 of approximately 10 μm, 40 μm, 60 μm, 100 μm, 125 μm, 188 μm, 200 μm, 300 μm, or any suitable thickness. In particular embodiments, low-birefringence substrate 480 may have a thickness 752 that is substantially uniform, where a substantially uniform thickness may refer to a substrate layer having a thickness variation of less than 1%, 2%, 5%, or any suitable percentage variation, across a transverse extent of the layer. As an example and not by way of limitation, a low-birefringence substrate 480 may have a thickness 752 of approximately 100 μm with a thickness variation of 2% or less so that the thickness 752 may vary between approximately 99 μm and 101 μm. Although this disclosure describes and illustrates particular low-birefringence substrates having particular thicknesses and particular thickness variations, this disclosure contemplates any suitable low-birefringence substrate having any suitable thickness and any suitable thickness variation.

In particular embodiments, ambient light coming from a light source, such as for example sunlight or room light, that is incident on or reflected from mechanical stack 700 may be referred to as a light ray, light beam, or optical beam. In particular embodiments, the polarization of a light ray may refer to the transverse electric field associated with the light ray. In particular embodiments, a light ray may have linear polarization, circular polarization, elliptical polarization, may be partially polarized, or may be unpolarized or randomly polarized. As an example and not by way of limitation, an ambient light source (e.g., sunlight or room light) may emit unpolarized light, and light from an unpolarized light source that passes through a linear polarizer will emerge from the polarizer as linearly polarized light. In particular embodiments, a light ray may be partially polarized or may have a polarization state that is a superposition of two or more polarization states, such as for example, a light ray may be a superposition of linearly-polarized light and unpolarized light. Although this disclosure describes and illustrates particular light sources and particular light rays having particular polarization states, this disclosure contemplates any suitable light source and any suitable light ray having any suitable polarization state.

In particular embodiments, the birefringence of a material may refer to a material having a refractive index that depends on the polarization or propagation direction of light. A material with little or no birefringence may be referred to as a low-birefringence material or a non-birefringent material. In particular embodiments, a low-birefringence material or a non-birefringent material may be referred to as an optically isotropic, isotropic, or substantially isotropic material. In particular embodiments, a material may have a refractive index that varies between $n_1$ and $n_2$, where $n_1$ is the material's maximum refractive index and $n_2$ is the material's minimum refractive index. In particular embodiments, refractive index $n_1$ may be associated with a material's refractive index along a first axis, and refractive index $n_2$ may be associated with a material's refractive index along a second axis. As an example and not by way of limitation, a linearly polarized light ray with its polarization aligned along a first axis of a material may experience a refractive index of $n_1$, while a linearly polarized light ray with its polarization aligned along a second axis of the material may experience a refractive index of $n_2$. In particular embodiments, the first and second axes may be substantially orthogonal. In particular embodiments, $n_1$ may be referred to as an ordinary refractive index, or $n_O$, and $n_2$ may be referred to an extraordinary refractive index, or $n_e$.

In particular embodiments, the birefringence (B) of a material may be expressed as a maximum difference between the refractive indices of a material so that B=abs$(n_1-n_2)$, where abs$(n_1-n_2)$ is the absolute value of the difference between $n_1$ and $n_2$. In particular embodiments, the maximum difference between refractive indices may be expressed in terms of a percentage so that a percentage birefringence may be defined as $$B(\%) = 100 \times \frac{\text{abs}(n_1 - n_2)}{\text{avg}(n_1, n_2)}\%,$$

where avg$(n_1, n_2)$ is the average of $n_1$ and $n_2$. In particular embodiments, a material having a low birefringence, such as for example low-birefringence substrate 480, may refer to a material with birefringence less than approximately $1\times10^{-5}$, $5\times10^{-5}$, $1\times10^{-4}$, $1.5\times10^{-4}$, $5\times10^{-4}$, $1\times10^{-3}$, or less than any suitable birefringence value. As an example and not by way of limitation, a low-birefringence material, such as for example, low-birefringence substrate 480, may have a maximum refractive index $n_1$ of approximately 1.5304 and a minimum refractive index $n_2$ of approximately 1.5302. From the above expression for birefringence, the birefringence of such a material may be approximately equal to B=1.5304−

$1.5302=2\times10^{-4}$. Although this disclosure describes and illustrates particular low-birefringence materials having particular maximum and minimum refractive indices and particular birefringence values, this disclosure contemplates any suitable low-birefringence material having any suitable maximum and minimum refractive indices and any suitable birefringence value.

In particular embodiments, the birefringence of a material (e.g., low-birefringence substrate 480) may be related to an optical retardation of the material, where optical retardation depends on the material thickness (e.g., thickness 752 of low-birefringence substrate 480) and the material birefringence, B, as described above. In particular embodiments, the optical retardation of a material may be referred to as the single-pass optical retardation, the single-pass retardation, or the retardation of the material. In particular embodiments, the retardation of a material may be expressed as the phase change between two polarizations of light that results from making a single pass through a given thickness of the material. As an example and not by way of limitation, a light ray may have one component of its polarization aligned along an axis of a material with refractive index $n_1$ and another component of its polarization aligned along an axis with refractive index $n_2$. The retardation may be expressed as the phase change between the two polarization components that results from making a single pass through a thickness t of the material. In particular embodiments, a material's retardation may be expressed in units of distance, such as for example in units of nanometers.

In particular embodiments, the retardation (R) of a material may be expressed as $R=t\times B=t\times abs(n_1-n_2)$, where t is the thickness of the material. In particular embodiments, a low-birefringence material, such as for example low-birefringence substrate 480 may have a single-pass optical retardation of less than approximately 2 nanometers, 5 nanometers, 10 nanometers, 15 nanometers, 20 nanometers, 30 nanometers, or less than any suitable retardation value. As an example and not by way of limitation, low-birefringence substrate 480 may have a thickness 752 of approximately $t=50$ μm and a birefringence of approximately $B=10^{-4}$. For such a low-birefringence substrate 480, the retardation is approximately $R=50\ \mu m\times0.0001=5$ nanometers. As another example and not by way of limitation, low-birefringence substrate 480 may have a thickness 752 of approximately $t=125$ μm and a birefringence of approximately $B=10^{-4}$. For such a low-birefringence substrate 480, the retardation is approximately $R=125\ \mu m\times0.0001=12.5$ nanometers. As yet another example and not by way of limitation, low-birefringence substrate 480 may have a thickness 752 of approximately $t=40$ μm and a birefringence of approximately $B=4\times10^{-4}$. For such a low-birefringence substrate 480, the retardation is approximately $R=40\ \mu m\times0.0004=16$ nanometers. As yet another example and not by way of limitation, low-birefringence substrate 480 may have a thickness 752 of approximately $t=200$ μm and a birefringence of approximately $B=1.5\times10^{-4}$. For such a low-birefringence substrate 480, the retardation is approximately $R=200\ \mu m\times0.00015=30$ nanometers. In particular embodiments, a light ray that passes through a birefringent material may have its polarization partially changed as a result of propagating through the birefringent material. As an example and not by way of limitation, a linearly or circularly polarized light ray that passes through a low-birefringence material may emerge from the material with a polarization that is partially elliptical. In particular embodiments, the amount of polarization change that occurs may depend on the propagation direction and polarization of the incident light ray and on the birefringence or retardation of the material. Although this disclosure describes and illustrates particular low-birefringence materials and substrates having particular optical retardations, this disclosure contemplates any suitable low-birefringence material or substrate having any suitable optical retardation.

In particular embodiments, mechanical stack 700 may include polarization layer 740, and polarization layer 740 may include polarization components, such as for example, a linear polarizer, a circular polarizer, a quarter-wave plate (or, quarter-wave retarder), a half-wave plate (or, half-wave retarder), or any suitable combination of any suitable polarization components. In the example of FIG. 7, polarization layer 740 includes polarizer 742 and quarter-wave plate 744, and polarizer 742 is located above quarter-wave plate 744. In FIG. 7, polarization layer 740 is located above low-birefringence substrate 480, and low-birefringence substrate 480 is located above display layer 730. In particular embodiments, polarizer 742 may be a linear polarizer, and polarization layer 740 in FIG. 7 may be referred to as a circular polarizer. In particular embodiments, a circular polarizer may refer to one or more optical elements that produce left- or right-circularly polarized light from unpolarized light that is incident on one side of the circular polarizer. Moreover, a circular polarizer may refer to one or more optical elements that produce linearly polarized light from left- or right-circularly polarized light that is incident on another side of the circular polarizer. As an example and not by way of limitation, unpolarized light that is incident on the upper surface (e.g., the side with polarizer 742) of polarization layer 740 in FIG. 7 will emerge from the lower surface of polarization layer 740 as circularly polarized light. Moreover, circularly polarized light that is incident on the lower surface (e.g., the side with quarter-wave plate 744) of polarization layer 740 in FIG. 7 will emerge from the upper surface of polarization layer 740 as circularly polarized light.

A linear polarizer, such as for example polarizer 742 in FIG. 7, may refer to an optical element that produces linearly polarized light from unpolarized incident light. As an example and not by way of limitation, linear polarizer 742 may be made of a sheet or film of polymer material. A quarter-wave plate, such as for example quarter-wave plate 744 in FIG. 7, may refer to an optical element that can produce elliptically or circularly polarized light from incident linearly polarized light. In particular embodiments, quarter-wave plate 744 may include a sheet of quarter-wave retarder film made from a polymer material, such as for example, a sheet made from a polycarbonate material. In particular embodiments, linear polarizer 742 and quarter-wave plate 744 may be bonded together with an adhesive layer, such as for example, an OCA. In particular embodiments, polarization layer 740 may include one or more layers of polymer material configured to act as a circular polarizer. Although this disclosure describes and illustrates particular polarization layers that include particular polarization components combined together in a particular order, this disclosure contemplates any suitable polarization layer that includes any suitable polarization components combined together in any suitable order.

Figure 8:
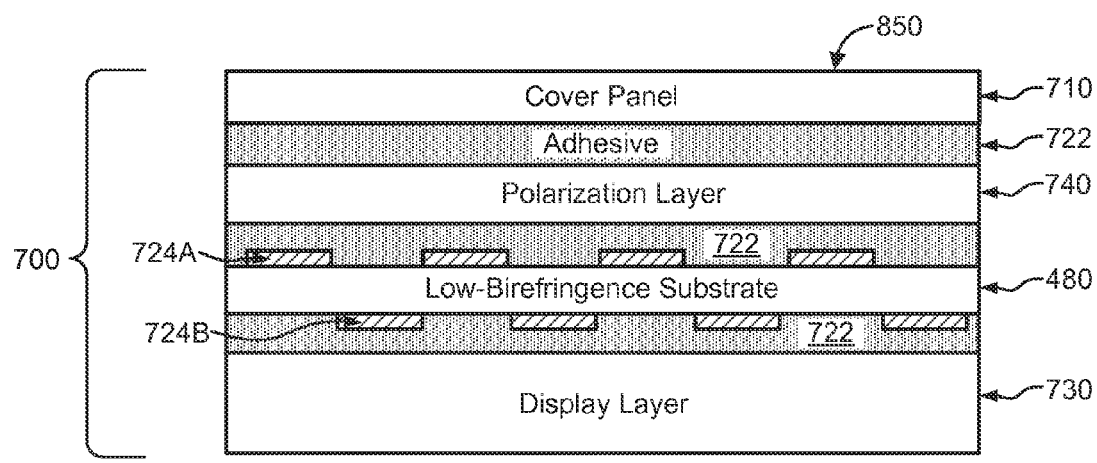
FIGS. 8-10 illustrate other example cross-sections of other example mechanical stacks.

FIG. 8 illustrates another example cross-section of another example mechanical stack 700. In FIG. 8, cover panel 710 is located above polarization layer 740, and polarization layer is located above low-birefringence substrate 480. A touch sensor may include double-sided substrate 480 with conductive material 724A and 724B disposed on its upper and lower surfaces, respectively. In the example of FIG. 8, low-birefringence substrate 480 is attached to display layer 730 with adhesive layer 722 so that there is no air gap between substrate 480 and display layer 730. In particular embodiments, one or more surfaces of mechanical stack 700 may include an anti-reflection (AR) coating 850. In particular embodiments, an AR coating may refer to a dielectric coating deposited on an optical surface, where the dielectric coating may include one or more thin-film layers of one or more dielectric materials. In FIG. 8, cover panel 710 has AR coating 850 on its upper surface. In particular embodiments, AR coating 850 may reduce the amount of incident light reflected off of a surface.

Figure 9:
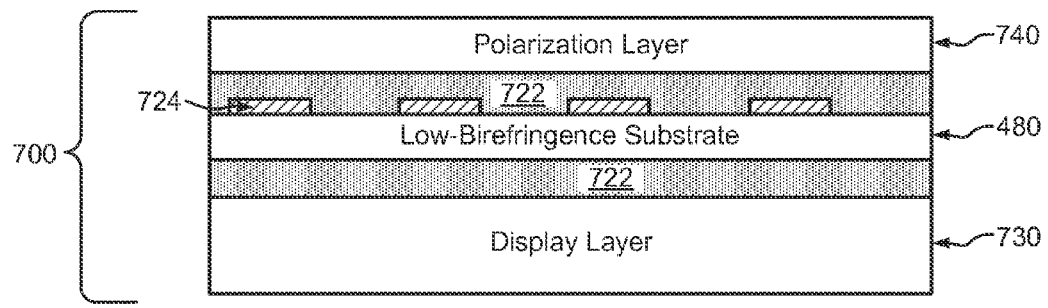

FIG. 9 illustrates another example cross-section of another example mechanical stack 700, which includes polarization layer 740, low-birefringence substrate 480, and display layer 730. Low-birefringence substrate 480, which is located below polarization layer 740, is a single-sided substrate 480 with conductive material 724 disposed on its upper surface. Portions of conductive material 724 may form the drive electrodes of a touch sensor, and other portions of conductive material 724 may form the sense electrodes. Low-birefringence substrate 480 is attached to display layer 730 with adhesive layer 722, and there is no air gap between substrate 480 and display layer 730. In particular embodiments, as illustrated in FIG. 9, mechanical stack 700 may not contain a cover panel. In FIG. 9, polarization layer 740 may act as a cover panel for mechanical stack 700. In particular embodiments, polarization layer 740 may include a coating, film, or layer on its top surface to provide a resilient surface suitable for repeated touching.

Figure 10:
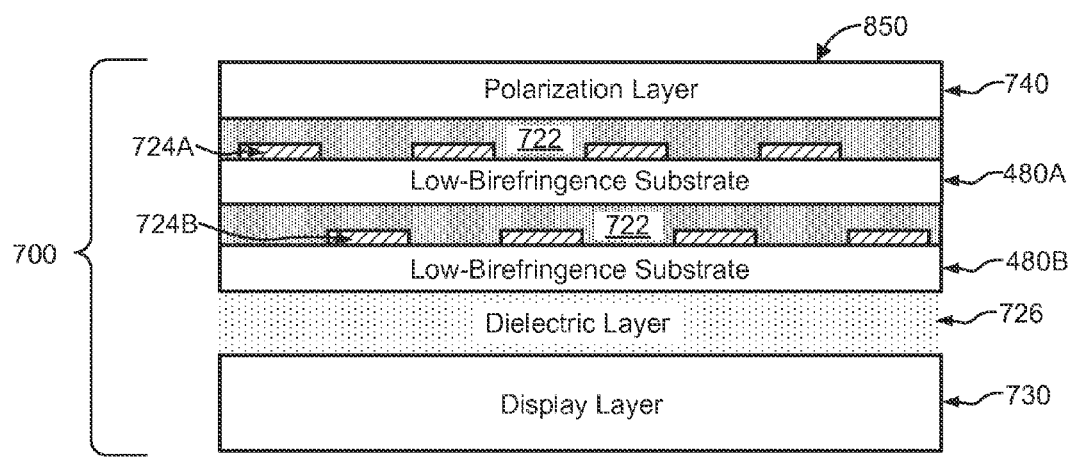

FIG. 10 illustrates another example cross-section of another example mechanical stack 700. In FIG. 10, polarization layer 740 is located above low-birefringence substrates 480A and 480B, which, in turn, are located above display layer 730. Dielectric layer 726, which is located between display layer 730 and low-birefringence substrate 480B, may be an adhesive layer or an air gap, as discussed above. In the example of FIG. 10, mechanical stack 700 does not include a cover panel, and as discussed above, polarization layer 740 may act as a cover panel. Additionally, polarization layer 740 may have an AR coating 850 on its top surface. In particular embodiments, AR coating 850 may act both as an anti-reflection coating and as a resilient surface suitable for repeated touching. In FIG. 10, mechanical stack 700 includes two single-sided low-birefringence substrates 480A and 480B with conductive material 724A disposed on a surface of substrate 480A, and conductive material 724B disposed on a surface of substrate 480B. As an example and not by way of limitation, the sense electrodes of a touch sensor may include conductive material 724A, and the drive electrodes of a touch sensor may include conductive material 724B.

Figure 11:
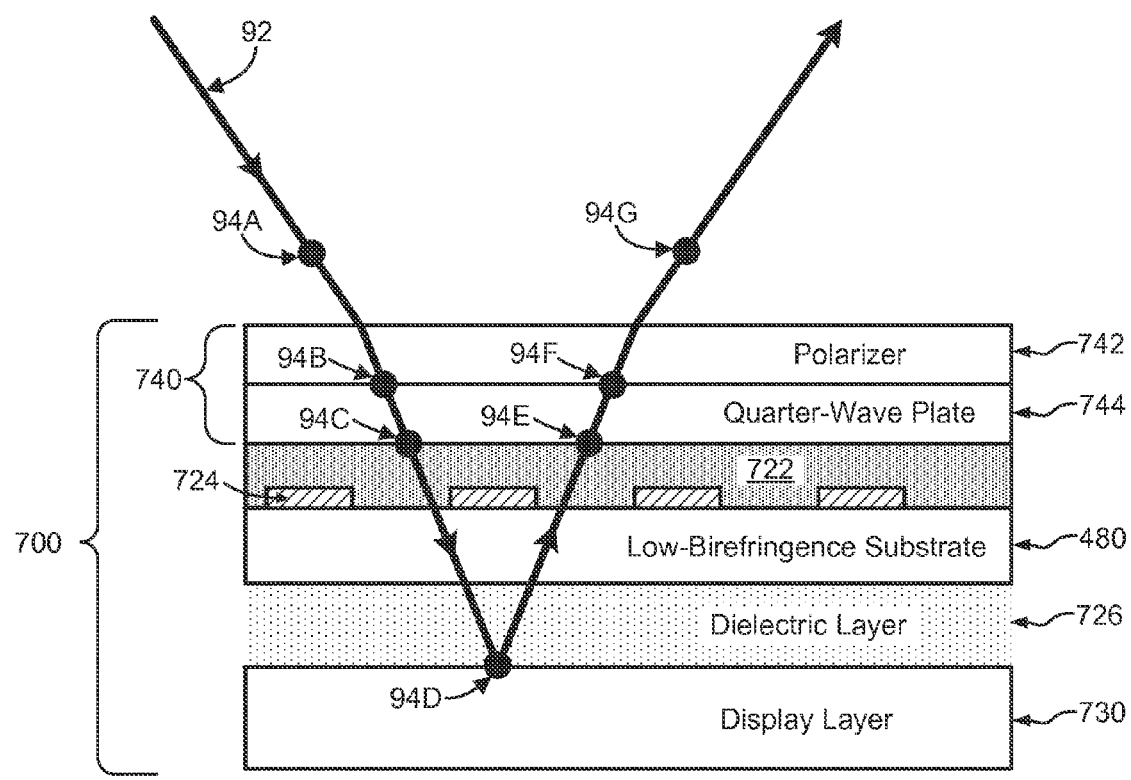
FIG. 11 illustrates an example mechanical stack with an example incident light ray.

FIG. 11 illustrates an example mechanical stack 700 with an example incident light ray 92. Light ray 92 may represent a source of ambient light external to display stack 700, such as for example, direct or indirect illumination from sunlight, room light, or any other suitable source of illumination. Points 94A-94G may be used to describe the state or the polarization of light ray 92 at various locations. Point 94A may represent incident light ray 92 before it enters mechanical stack 700, and at point 94A, light ray 94A may be substantially unpolarized. At point 94B, after passing through polarizer 742, light ray 92 may be linearly polarized with its polarization axis aligned substantially parallel to the transmission axis of polarizer 742. At point 94C, after passing through quarter-wave plate 744, light ray 92 may be circularly polarized. Depending on the relative orientations of polarizer 742 and quarter-wave plate 744, light ray 92 at point 94C may be right- or left-circularly polarized. At point 94D, light ray 92 may reflect off of the interface between dielectric layer 726 and display layer 730, and light ray 92 may continue to point 94E. In particular embodiments, light ray 92 at point 94D may be partially transmitted and partially reflected from the interface so that a portion of light ray 92 is transmitted into display layer 730 while another portion is reflected from the interface.

In the example of FIG. 11, at points 94D and 94E, light ray 92 may remain in a substantially circularly polarized state. At point 94F, after passing through quarter-wave plate 744, light ray 92 may be linearly polarized with its polarization axis aligned substantially orthogonal to the transmission axis of polarizer 742. At point 94G, light ray 92 emerges from mechanical stack 700. Since the polarization axis of light ray 92 at point 94F is orthogonal to the transmission axis of polarizer 742, substantially all of light ray 92 is blocked or absorbed by polarizer 742. So, the power of light ray 92 at point 94G may be a small fraction of the power of incident light ray 92 at point 94A. As an example and not by way of limitation, light ray 92 at point 94G, exiting from mechanical stack 700, may have less than approximately 0.5%, 1%, 2%, 5%, or any suitable percentage of the power of incident light ray 92 at point 94A.

In particular embodiments, light ray 92 may be partially reflected and partially transmitted or absorbed by any suitable interface between any suitable layers of mechanical stack 700. As an example and not by way of limitation, light ray 92 may be partially reflected and partially transmitted by the interface between low-birefringence substrate 480 and dielectric layer 726. In particular embodiments, light ray 92 may be partially reflected and partially absorbed by one or more portions of conductive material 724. As an example and not by way of limitation, conductive material 724 may be copper or a copper-based material, and conductive material 724 may reflect between approximately 40% and 90% of incident visible light. In particular embodiments, polarization layer 740 may provide a low-glare functionality for display stack 700 by substantially extinguishing incident light 92 that is reflected from one or more surfaces or interfaces between layers of display stack 700. Although this disclosure describes and illustrates particular light rays reflected from particular interfaces of particular mechanical stacks, this disclosure contemplates any suitable light rays reflected from any suitable interfaces of any suitable mechanical stacks.

In the example of FIG. 11, in traveling between points 94C and 94E, light ray 92 makes two passes through low-birefringence substrate 480. In particular embodiments, the polarization of light ray 92 may be slightly changed due to the low-birefringence substrate 480. As an example and not by way of limitation, if low-birefringence substrate 480 has a single-pass retardation of less than 5 nanometers, then, between points 94C and 94E, the two orthogonal electric-field components of light ray 92 may accumulate an additional relative phase shift of 10 nanometers. As another example and not by way of limitation, light ray 92 may be circularly polarized at point 94C, and at point 94E, light ray 92 may be slightly depolarized or slightly elliptically polarized. In particular embodiments, polarization layer 740 may provide a low-glare functionality for display stack 700, and low-birefringence substrate 480 may impart a retardation to an incident light ray 92 that may not substantially degrade the glare-reduction functionality provided by polarization layer 740. As an example and not by way of limitation, glare-reduction provided by polarization layer 740 and low-birefringence substrate 480 may improve the visibility of display layer 730 in the presence of an ambient light source, such as for example, sunlight. In particular embodiments, mechanical stack 700 may include polarization layer 740 located above one or more low-birefringence substrates 480, and mechanical stack 700 may provide glare-reduction for a touch screen or display device that may be used in an automobile or in an outdoor application. As an example and not by way of limitation, mechanical stack 700 may be a touch screen located in the dashboard of an automobile. As another example and not by way of limitation, mechanical stack 700 may be a touchscreen that is part of a mobile device configured to operate outdoors in bright sunlight conditions.

Herein, reference to a computer-readable non-transitory storage medium or media may include one or more semiconductor-based or other integrated circuits (ICs) (such as, for example, a field-programmable gate array (FPGA) or an application-specific IC (ASIC)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards, SECURE DIGITAL drives, any other suitable computer-readable non-transitory storage medium or media, or any suitable combination of two or more of these, where appropriate. A computer-readable non-transitory storage medium or media may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, functions, operations, or steps, any of these embodiments may include any combination or permutation of any of the components, elements, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. An apparatus comprising:
a substrate comprising a material having a birefringence B that is less than approximately $1.5 \times 10^{-4}$, wherein:
the birefringence of the material of the substrate is expressed as $B=n_1-n_2$;
$n_1$ is a maximum refractive index of the material of the substrate, the maximum refractive index associated with a refractive index of the material of the substrate along a first axis; and
$n_2$ is a minimum refractive index of the material of the substrate, the minimum refractive index associated with a refractive index of the material of the substrate along a second axis; and
one or more electrodes of a touch sensor disposed on the substrate.

2. The apparatus of claim 1, wherein the substrate is located above a display.

3. The apparatus of claim 1, wherein the substrate material is cyclic olefin polymer, cyclic olefin copolymer, cyclic block copolymer, tri-acetate cellulose, or polyethersulfone.

4. The apparatus of claim 1, wherein the substrate has a substantially uniform thickness that is between approximately 10 micrometers and approximately 200 micrometers.

5. The apparatus of claim 1, wherein the substrate has a single-pass optical retardation of less than approximately 30 nanometers.

6. The apparatus of claim 1, wherein the electrodes are made of a conductive mesh of conductive material.

7. The apparatus of claim 1, wherein the substrate is located below a polarization layer.

8. The apparatus of claim 7, wherein the polarization layer comprises a linear polarizer or a combination of the linear polarizer and a quarter-wave plate.

9. The apparatus of claim 1, wherein:
the substrate comprises an upper surface and a lower surface;
one or more first ones of the electrodes are disposed on the upper surface of the substrate; and
one or more second ones of the electrodes are disposed on the lower surface of the substrate.

10. The apparatus of claim 1, wherein:
the substrate comprises an upper surface and a lower surface; and
all the electrodes are disposed on the upper surface or the lower surface of the substrate.

11. The apparatus of claim 1, wherein:
the apparatus comprises two substrates comprising the material having the birefringence B that is less than approximately $1.5 \times 10^{-4}$;
one or more of the electrodes are disposed on a surface of a first one of the substrates; and
one or more of the electrodes are disposed on a surface of a second one of the substrates.

12. The apparatus of claim 1, further comprising an additional layer, other than the substrate on which the one or more electrodes of the touch sensor are disposed, that comprises a material having a birefringence B that is less than approximately $1.5 \times 10^{-4}$, wherein:
the birefringence of the material of the additional layer is expressed as $B=n_1-n_2$;
$n_1$ is a maximum refractive index of the material of the additional layer; and
$n_2$ is a minimum refractive index of the material of the additional layer.

13. A device comprising:
a substrate comprising a material having a birefringence B that is less than approximately $1.5 \times 10^{-4}$, wherein:
the birefringence of the material of the substrate is expressed as $B=n_1-n_2$;
$n_1$ is a maximum refractive index of the material of the substrate, the maximum refractive index associated with a refractive index of the material of the substrate along a first axis; and $n_2$ is a minimum refractive index of the material of the substrate, the minimum refractive index associated with a refractive index of the material of the substrate along a second axis;

one or more electrodes of a touch sensor disposed on the substrate; and one or more computer-readable non-transitory storage media embodying logic that is configured when executed to control the touch sensor.

14. The device of claim 13, further comprising a display located below the substrate.

15. The device of claim 13, wherein the substrate material is cyclic olefin polymer, cyclic olefin copolymer, cyclic block copolymer, tri-acetate cellulose, or polyethersulfone.

16. The device of claim 13, wherein the substrate has a substantially uniform thickness that is between approximately 10 micrometers and approximately 200 micrometers.

17. The device of claim 13, wherein the substrate has a single-pass optical retardation of less than approximately 30 nanometers.

18. The device of claim 13, wherein the substrate is located below a polarization layer.

19. The device of claim 18, wherein the polarization layer comprises a linear polarizer or a combination of the linear polarizer and a quarter-wave plate.

20. The device of claim 13, further comprising an additional layer, other than the substrate on which the one or more electrodes of the touch sensor are disposed, that comprises a material having a birefringence B that is less than approximately $1.5 \times 10^{-4}$, wherein:

the birefringence of the material of the additional layer is expressed as $B = n_1 - n_2$;

$n_1$ is a maximum refractive index of the material of the additional layer; and $n_2$ is a minimum refractive index of the material of the additional layer.

* * * * *